US009298860B1

(12) United States Patent
Preda et al.

(10) Patent No.: US 9,298,860 B1
(45) Date of Patent: Mar. 29, 2016

(54) SEPARATION OF MODELS BASED ON PRESENCE OR ABSENCE OF A FEATURE SET AND SELECTION OF MODEL BASED ON SAME

(71) Applicant: Quantcast Corporation, San Francisco, CA (US)

(72) Inventors: Daniel Ciprian Preda, Richmond, CA (US); Peter William Kassakian, South San Francisco, CA (US)

(73) Assignee: Quantcast Corporation, San Francisco, CA (US)

( * ) Notice: Subject to any disclaimer, the term of this patent is extended or adjusted under 35 U.S.C. 154(b) by 300 days.

(21) Appl. No.: 13/834,417

(22) Filed: Mar. 15, 2013

(51) Int. Cl.
G06G 7/48 (2006.01)
G06F 17/50 (2006.01)
G06Q 30/02 (2012.01)

(52) U.S. Cl.
CPC ........ *G06F 17/5009* (2013.01); *G06Q 30/0275* (2013.01)

(58) Field of Classification Search
CPC .................... G06Q 30/0275; G06F 17/5009
See application file for complete search history.

(56) References Cited

U.S. PATENT DOCUMENTS

| | | | |
|---|---|---|---|
| 7,406,434 B1* | 7/2008 | Chang et al. | 705/14.43 |
| 8,126,881 B1* | 2/2012 | Sethi et al. | 707/723 |
| 8,175,914 B1* | 5/2012 | Benson et al. | 705/14.71 |
| 8,706,656 B1* | 4/2014 | Lin et al. | 706/12 |
| 2007/0055569 A1* | 3/2007 | Subramanian et al. | 705/14 |
| 2012/0166291 A1* | 6/2012 | Broder et al. | 705/14.71 |
| 2013/0325530 A1* | 12/2013 | Pal et al. | 705/7.11 |
| 2014/0032306 A1* | 1/2014 | Sukornyk et al. | 705/14.43 |
| 2014/0046754 A1* | 2/2014 | Lee et al. | 705/14.41 |
| 2014/0100944 A1* | 4/2014 | Zhu et al. | 705/14.41 |
| 2014/0180815 A1* | 6/2014 | Chatwin et al. | 705/14.54 |
| 2014/0222583 A1* | 8/2014 | Bullock et al. | 705/14.66 |

OTHER PUBLICATIONS

Andrew Karp, "Using logistic regression to predict customer retention," 1998, NESUG 1998, five pages.*
Ajit V. Rao et al., "A deterministic annealing approach for parsimonious design of piecewise regression models," 1999, IEEE Transactions on Pattern Analysis and Machine Intelligence, vol. 21, No. 2, pp. 159-173.*
Jian Liu et al., "On segmented multivariate regression," 1997, Statistica Sinica, vol. 7, pp. 497-525.*
C. Olivia Rud, "New Age Marketing: Past Life Regression versus Logistic Regression," 1995, SESUG 95 Proceedings, pp. 410-418.*

(Continued)

*Primary Examiner* — Kamini S Shah
*Assistant Examiner* — Russ Guill
(74) *Attorney, Agent, or Firm* — Fenwick & West LLP; Robin W. Reasoner; Renee Jacowitz

(57) ABSTRACT

Separate models are built to predict the likelihood of conversion based on the presence or absence of one or more features. For example, a first model may be built to predict the likelihood of conversion of a non-converter who has never visited an advertiser's website before and a second model may be built to predict the likelihood of conversion of a non-converter who has visited an advertiser's website before. To determine which model to apply to an entity, the consumption history of the entity is searched for the presence or absence of the one or more features used to separate the models. The entity's consumption history is then scored based on the applicable model to determine the likelihood of conversion.

15 Claims, 6 Drawing Sheets

(56) References Cited

OTHER PUBLICATIONS

Tin Kam Ho et al., "Decision combination in multiple classifier systems," 1994, IEEE Transactions on Pattern Analysis and Machine Intelligence, vol. 16, No. 1, pp. 66-75.*

Grigorios Tsoumakas et al., "Multi-Label Classification: An Overview," 2007, Citeseer, 17 pages.*

Mohamed Aly, "Survey on multiclass classification methods," 2005, Citeseer, pp. 1-9.*

Yu-Yu Chou et al., "A hierarchical multiple classifier learning algorithm," 2003, Pattern Analysis Applications, vol. 6, pp. 150-168.*

Yu-Chiang Frank Wang et al., "A support vector hierarchical method for multi-class classification and rejection," 2009, Proceedings of International Joint Conference on Neural Networks, pp. 3281-3288.*

Maytal Saar-Tsechansky et al., "Handling missing values when applying classification models," 2007, Journal of Machine Learning Research, vol. 8, pp. 1625-1657.*

\* cited by examiner

SEPARATION OF MODELS BASED ON PRESENCE OR ABSENCE OF A FEATURE SET AND SELECTION OF MODEL BASED ON SAME

BACKGROUND

1. Technical Field

This invention pertains in general to modeling behavior for use in predicting the likelihood of conversion in an online advertising campaign, and in particular to modeling behavior based on the presence or absence of a set of features.

2. Description of Related Art

In general, online advertising campaign managers are seeking to maximize the impact of an advertising campaign. One measure of an advertising campaign's impact is the number of conversions. A conversion occurs when a user takes an action deemed desirable by the advertiser, such as buying an advertised product, visiting a website, signing up for a service, etc. By analyzing features of an advertising opportunity and features from the consumption histories of converters versus non-converters, models can be developed to predict whether a particular user is likely to become a converter and/or whether a particular advertising opportunity is likely to result in a conversion. Typically, to analyze these features, a single model is formed for each advertising campaign to use to assess each bidding opportunity for the campaign (i.e., an opportunity to display an advertisement in an available slot, for example on a web page visited by an entity, that is auctioned to the highest bidder). However, in reality, certain features of the bidding opportunity or the entity's media consumption history, such as whether an entity has visited the advertiser's website before, might be so highly relevant to the determination of whether a particular advertising opportunity is likely to result in a conversion that it dwarfs the other signals in the model. In such situations, an improved modeling scheme is desirable to enhance the predictive capabilities of such models and allow for finer grain differentiation between bidding opportunities.

SUMMARY

Embodiments of the invention include a method, a non-transitory computer readable storage medium and a system for building separate models to predict the likelihood of conversion based on the presence or absence of one or more features. For example, a first model may be built to predict the likelihood of conversion of a non-converter who has never visited an advertiser's website before and a second model may be built to predict the likelihood of conversion of a non-converter who has visited an advertiser's website before. To determine which model to apply to an entity, the consumption history of the entity is searched for the presence or absence of the one or more features used to separate the models. In this example, the consumption history of the entity is searched for a previous visit to the advertiser's website. If the entity has not previously visited the advertiser's website, the first model is applicable. If the entity has previously visited the advertiser's website, the second model is applicable. The entity's consumption history is then scored based on the model to determine the likelihood of conversion.

Embodiments of the computer-readable storage medium store computer-executable instructions for performing the steps described above. Embodiments of the system further comprise a processor for executing the computer-executable instructions.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The figures depict embodiments of the present invention for purposes of illustration only. One skilled in the art will readily recognize from the following description that alternative embodiments of the structures and methods illustrated herein may be employed without departing from the principles of the invention described herein.

DETAILED DESCRIPTION

Embodiments of the invention build separate models to predict the likelihood of conversion based on the presence or absence of one or more features in the consumption history of an entity. The following description uses the context of Internet advertising for ease of explanation, but it is noted that embodiments of the invention may be used for predicting likelihood of conversions in other networked media, such as networked television, by using similar methodology as described herein.

Server System

Figure 1:
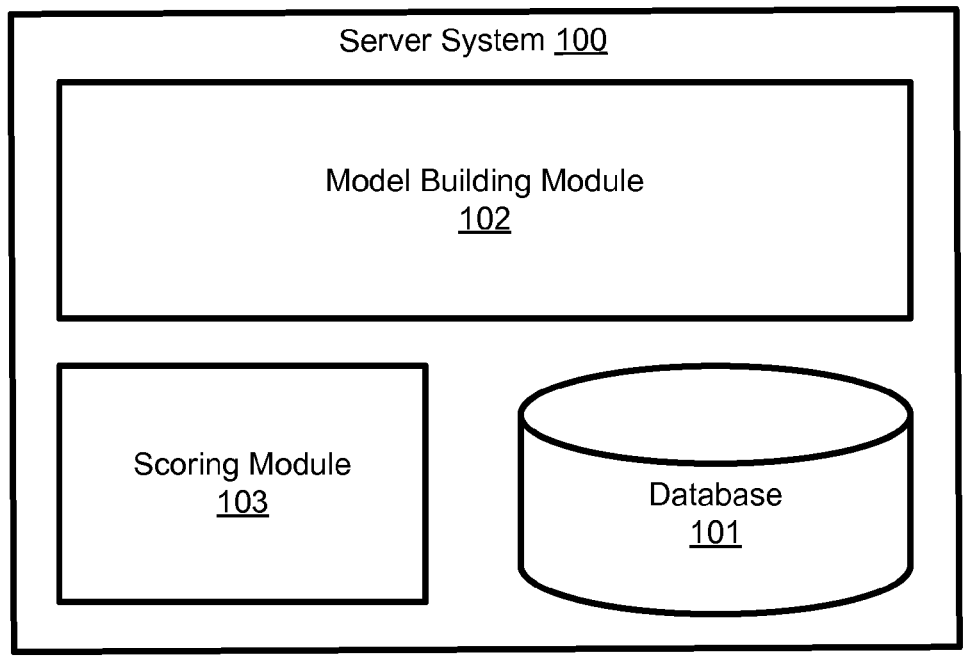
FIG. 1 is a high-level block diagram of a server system, in accordance with an embodiment of the invention.

FIG. 1 is a high-level block diagram of a server system 100, in accordance with an embodiment. The server system 100 stores media consumption histories of entities, builds models to predict the likelihood that an entity will become a converter, and applies a model to an entity's media consumption history. In some embodiments, the server system 100 is implemented as a single server, while in other embodiments it is implemented as a distributed system of multiple servers. For convenience of explanation, the server system 100 is described below as being implemented on a single server system. The server system 100 includes a database 101, a model building module 102, and a scoring module 103.

The database 101 stores data needed by the server system 100 to build models and score the consumption histories of entities based on those models. This data includes media consumption events and may include data from other resources such as bidding opportunity histories associated with respective identifiers of entities. A media consumption event is the act of accessing content over a network, such as, but not limited to, accessing a web page from a web server. A variety of methods exist for associating an anonymous identifier with a web browser. For example, a hardware device identifier such as a Media Access Control Address (MAC address) which can be stored on a device operated by a user to access content over a network. As another example, a software identifier such as a cookie value can be locally stored. In other embodiments, identifiers can be composed and/or stored remotely from a device associated with the user. In some cases, a browser can have multiple identifiers, such as multiple first party cookies and multiple third party cookies, which can be used to identify the browser to various systems. A direct measurement system can collect and/or receive information for a browser or a system in conjunction with the identifier. In some cases, information collected and/or received by the direct measurement system can be processed before it is stored. For example, when a browser requests content from a content provider, the content provider can re-direct the browser to submit a pixel request to the direct measurement system. Based on the pixel request, and optional subsequent actions and/or interactions, the direct measurement system can collect and/or receive information from the browser in conjunction with an identifier in order to enable the maintenance of a coherent body of information, such as a consumption history, a portion of a consumption history, a consumption history score, a consumption history characterization and/or a consumption history digest, over time.

The model building module 102 builds separate models to predict the likelihood of conversion based on the presence or absence of one or more features in the consumption history of an entity or the bidding opportunity history or combinations thereof. For example, a first model may be built to predict the likelihood of conversion of a non-converter who has never visited an advertiser's website before and a second model may be built to predict the likelihood of conversion of a non-converter who has visited an advertiser's website before. The model building module 102 will be described in further detail with reference to FIG. 2 below.

The scoring module 103 determines a score for an entity by first determining which model of the plurality of models built by the model building module 102 is applicable to the entity, and then analyzing events in the media consumption history of the entity against features of the applicable model. Specifically, the entity's media consumption history is scored based on which features in the feature set of the applicable model are present in the entity's media consumption history. The score is used to indicate the likelihood that an entity will convert.

Figure 2:
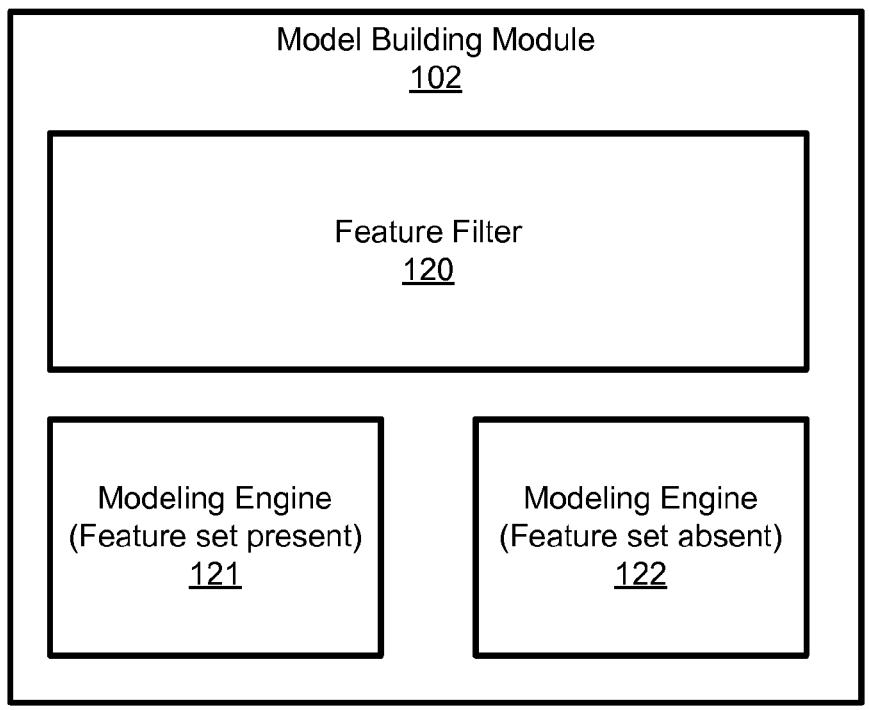
FIG. 2 is a block diagram of a model building module of the server system of FIG. 1, in accordance with an embodiment of the invention.

FIG. 2 is a block diagram of a model building module 102 of the server system 100 of FIG. 1, in accordance with an embodiment of the invention. The model building module 102 includes a feature filter 120 and a plurality of modeling engines 121, 122. In this example, the model building module 102 includes two modeling engines 121, 122, but in other implementations any number of modeling engines may be used.

Figure 3:
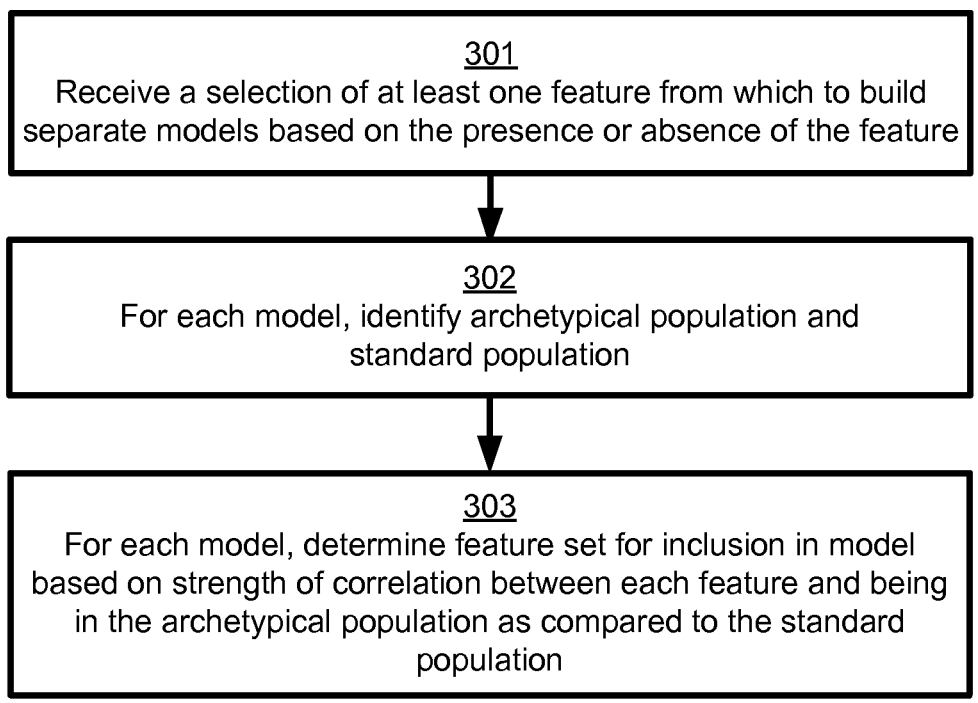
FIG. 3 is a flow chart illustrating a method of building separate models based on the presence or absence of at least one feature, in accordance with an embodiment of the invention.

The operation of the feature filter 120 and the modeling engines 121, 122 will be described with reference to the flowchart illustrated in FIG. 3. FIG. 3 illustrates a method of building separate models based on the presence or absence of at least one feature, in accordance with an embodiment of the invention. In some implementations, the steps are performed in an order other than the order presented in FIG. 3, and in other implementations, additional or alternative steps may be performed.

In step 301, the feature filter 120 of the model building module 102 receives a selection of at least one feature from which to build separate models based on the presence or absence of the feature or features. Examples of features from which to build separate models include features that differentiate a general population from a population that has already shown some demonstrated interest in an advertiser's brand, such as by visiting the advertiser's website, conducting a search for a brand name (a "branded search"), or purchasing one of the advertiser's products in the past. The feature filter 120 applies a filter to separate entities into groups based on the presence or absence of the feature or features in order to facilitate the building of separate models. In the simplest case, the filter separates entities into a first group that has the selected feature and a second group that does not have the selected feature. In a more complex case corresponding to some embodiments, some entities may belong to more than group because of the presence or absence of various features. The feature filter 120 passes each group to a separate modeling engine 121, 122. In the simple example, the feature filter 120 passes the group of entities where the feature set is present to modeling engine 121, and the feature filter 120 passes the group of entities where the feature set is absent to modeling engine 122.

In step 302, each modeling engine 121,122, acting on one of the groups, identifies an archetypical population and a standard population from the entities in the group. The archetypical population is selected to reflect the goals of the advertising campaign. Campaign managers typically look to build on prior success by seeking other people who are like the people who have responded positively to the campaign or the advertised product in the past. In such situations, the definition of the archetypical population may be the population that has a specific conversion event in their respective consumption histories (such as a click-through at a particular website, a product purchase event, the completion of a registration form, or other improved engagement with a website). In one embodiment, the definition of the archetype is made with reference to an observable media consumption event, but may also include other attributes (such as geographic attributes, computer attributes, or any other type of attributes) to use to filter entities before building the model. Thus, by analyzing consumption history and other data members of the archetype can be distinguished from non-members of the archetype. Most commonly, the members of the archetype from the group are the converters. The non-members of the archetype from the group are referred to as the standard population. The standard population is used for comparison purposes (i.e., as a baseline) to the archetypical population.

In step 303, each modeling engine 121, 122 determines a feature set for inclusion in the respective model. The modeling engine extracts and selects features from the consumption histories of the archetypical population that are most strongly correlated to being in the archetypical population versus the standard population for the group. It is noted that the features for the model built by modeling engine 121 (where the differentiating feature set is present) are expected to differ at least in some respects from the features for the model built by modeling engine 122 (where the differentiating feature set is absent). It is the differences between the models that result in better predictions by selecting the applicable model for an entity rather than using a monolithic model for all entities.

Figure 4:
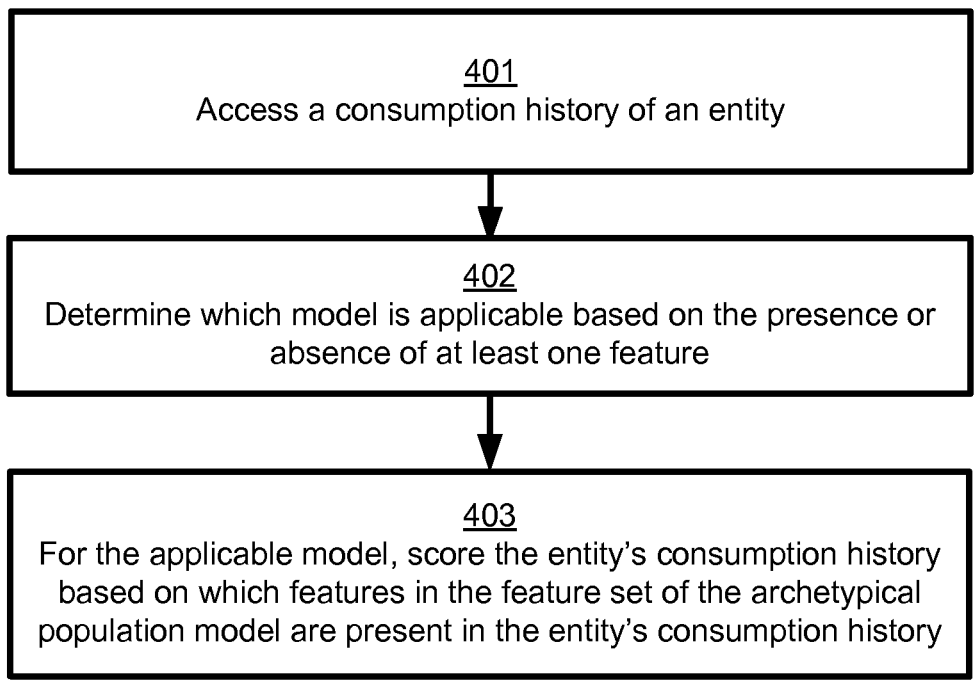
FIG. 4 is a flow chart illustrating a method of selecting and applying a model based on the presence or absence of at least one feature, in accordance with an embodiment of the invention.

FIG. 4 is a flow chart illustration a method of selecting and applying a model based on the presence or absence of at least one feature, in accordance with an embodiment of the invention. The selection and application of a model may be performed, for example, by the scoring module 103 of the server system 100. In some implementations, the steps are performed in an order other than the order presented in FIG. 4, and in other implementations, additional or alternative steps may be performed.

In step 401, a consumption history of an entity is accessed. For example, the scoring module 103 may receive an identifier, for example an identifier associated with the intended recipient of an advertising exposure, and use it to look up an associated media consumption history stored in database 101.

In step 402, the model that is applicable to the entity is determined based on the presence or absence of the feature used to differentiate the models. For example, if the models are separated based on the presence or absence of a previous visit to an advertiser's website, then the scoring module 103 determines which of these models to apply to an entity based on the presence of absence of a previous visit to an advertiser's website in the consumption history of the entity.

In step 403, the entity's consumption history is scored against the applicable model based on which features in the feature set of the archetypical population model built by modeling engine 121 or 122 are present in the entity's consumption history. In the example that the archetypical population is a group of converters, the score predicts the likelihood that an entity will convert based on the similarity of the entity to other converters.

Example Models

Methods and systems have been generally described above for predicting the likelihood that an entity will behave similarly to other entities that have certain media consumption events in common. In this section, several more specific examples will be provided to illustrate embodiments of the invention that build separate models to predict the likelihood of conversion based on the presence or absence of one or more features, in comparison to FIG. 5, which illustrates a prior art method of forming a single model.

Figure 5:
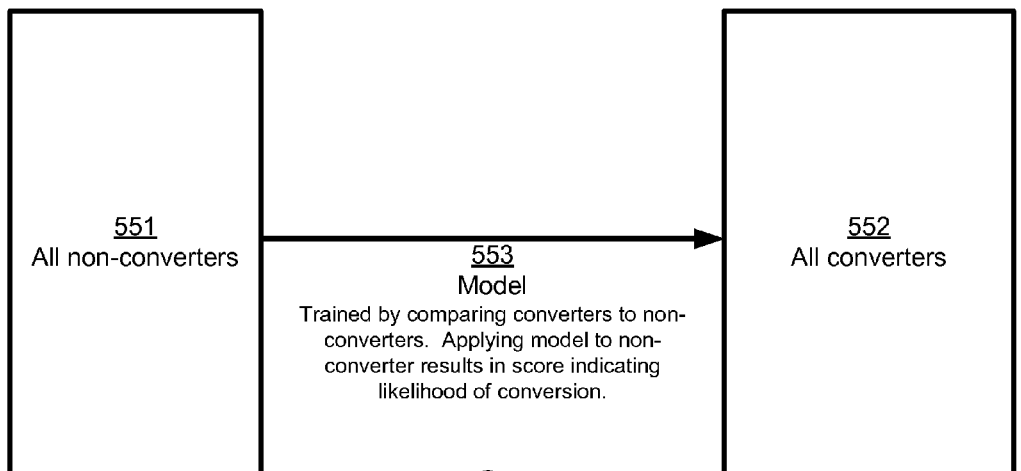
FIG. 5 is an illustration of a prior art model trained with the population of all converters compared to all non-converters.
Figure 6:
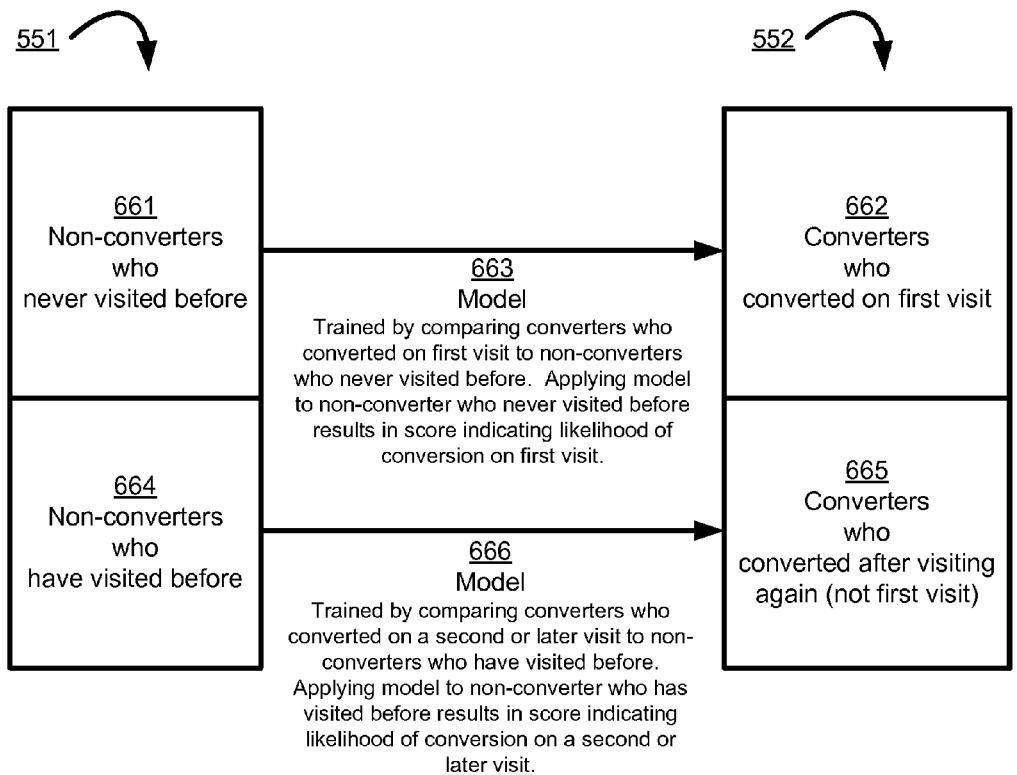
FIG. 6 is an illustration of two example models that were built based on the presence or absence of the feature of at least one previous visit to an advertiser's website, one model trained by comparing converters who converted on a first visit to non-converters who never visited before, and the other model trained by comparing converters who converted on a second or later visit to non-converters who have visited before.
Figure 7:
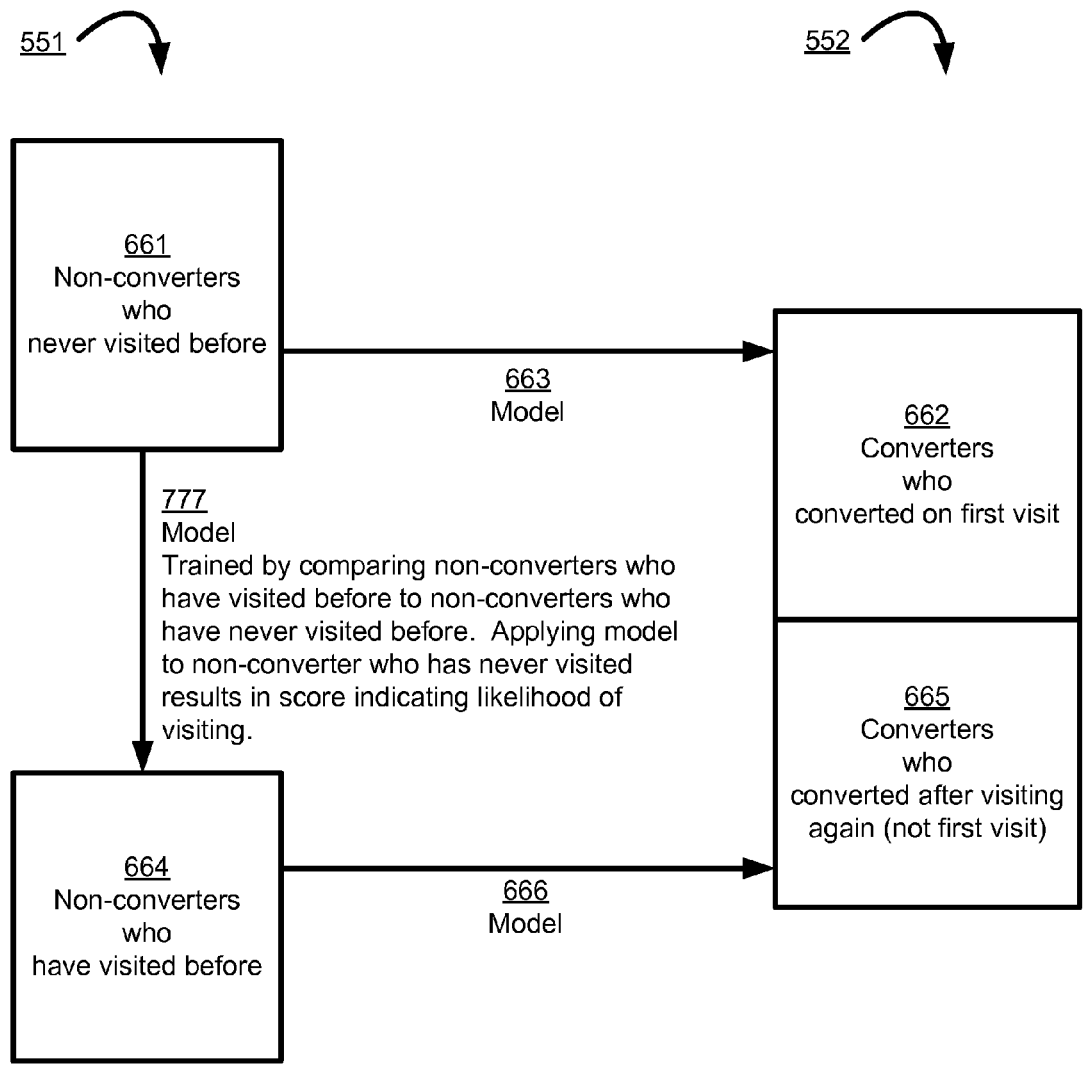
FIG. 7 is an illustration of three example models, where two of the three models are the same as illustrated in FIG. 6, and the third model is trained by comparing non-converters who have visited before to non-converters who have never visited before.

In each of FIGS. 5-7, an arrow between two boxes indicates a model trained using the populations defined by the boxes at the ends of the arrow. Thus, FIG. 5 is an illustration of a prior art model 553 trained with the population of all converters 552 compared to all non-converters 551. When a non-converter is encountered, model 553 would be applied to obtain a score which indicated the likelihood of conversion. Visually, the score represents the likelihood of the entity moving in the direction of the arrow 553 representing the model (i.e., moving from being a member of all non-converters 551 to being a member of all converters 552). Contrast the monolithic model of FIG. 5 to the differentiated models of FIGS. 6 and 7.

FIG. 6 is an illustration of two example models 663, 666 that were built according to an embodiment of the invention. Models 663 and 666 are based on the presence or absence of the feature of at least one previous visit to an advertiser's website. Model 663 was trained by comparing converters who converted on a first visit 662 to non-converters who never visited before 661. Applying the model 663 to a non-converter who never visited before results in a score indicating the likelihood of conversion by the entity on the first visit. Model 666 was trained by comparing converters who converted on a second or later visit 665 to non-converters who have visited before 664. Applying the model 666 to a non-converter who has visited before results in a score indicating the likelihood of conversion on a second or later visit (i.e., not the first visit). It is noted that in this example, the non-converters who never visited before 661 and the non-converters who have visited before 664 together define the entire population of all non-converters 551, but that need not always be the case, depending on the feature or feature set used to separate the models at the building and application stages. Similarly, in this example, the converters who converted on the first visit 662 and the converters who converted after visiting again (not first visit) 665 together define the entire population of all converters 552, but that need not always be the case, again depending on the feature of feature set used to separate the models at the building and application stages.

FIG. 7 is an illustration of three example models, where two of the three models are the same as illustrated in FIG. 6, and the third model is trained by comparing non-converters who have visited before to non-converters who have never visited before. In this example, a more sophisticated scoring can be performed by scoring module 103 of the server system 100. As illustrated in FIG. 7, there are two paths by which a non-converter who has never visited before 661 may end up as a member of all converters 552. For the first path, model 663 can be used to predict the likelihood that a non-converter who has never visited before 661 will become a member of the converters who converted on the first visit 662. For the second path, model 777 can be used to predict the likelihood that a non-converter who has never visited before 661 will become a non-converter who has visited before, and then model 666 can be used to predict the likelihood that the entity will transition from being a non-converter who has visited before 664 to become a converter who converted after visiting again 665.

In the example of FIG. 7, to score an entity who has never visited before, the likelihood that the entity will end up as a converter can be determined by a combination of the scores from all three models 663, 777, and 666. For example, the overall score may be the score from model 663 added to the product of the score from model 777 and the score from model 666. Alternative score combination methods may also be used, and the score combination method may be calibrated further based on empirical data over time.

Physical Components of a Computer

Figure 8:
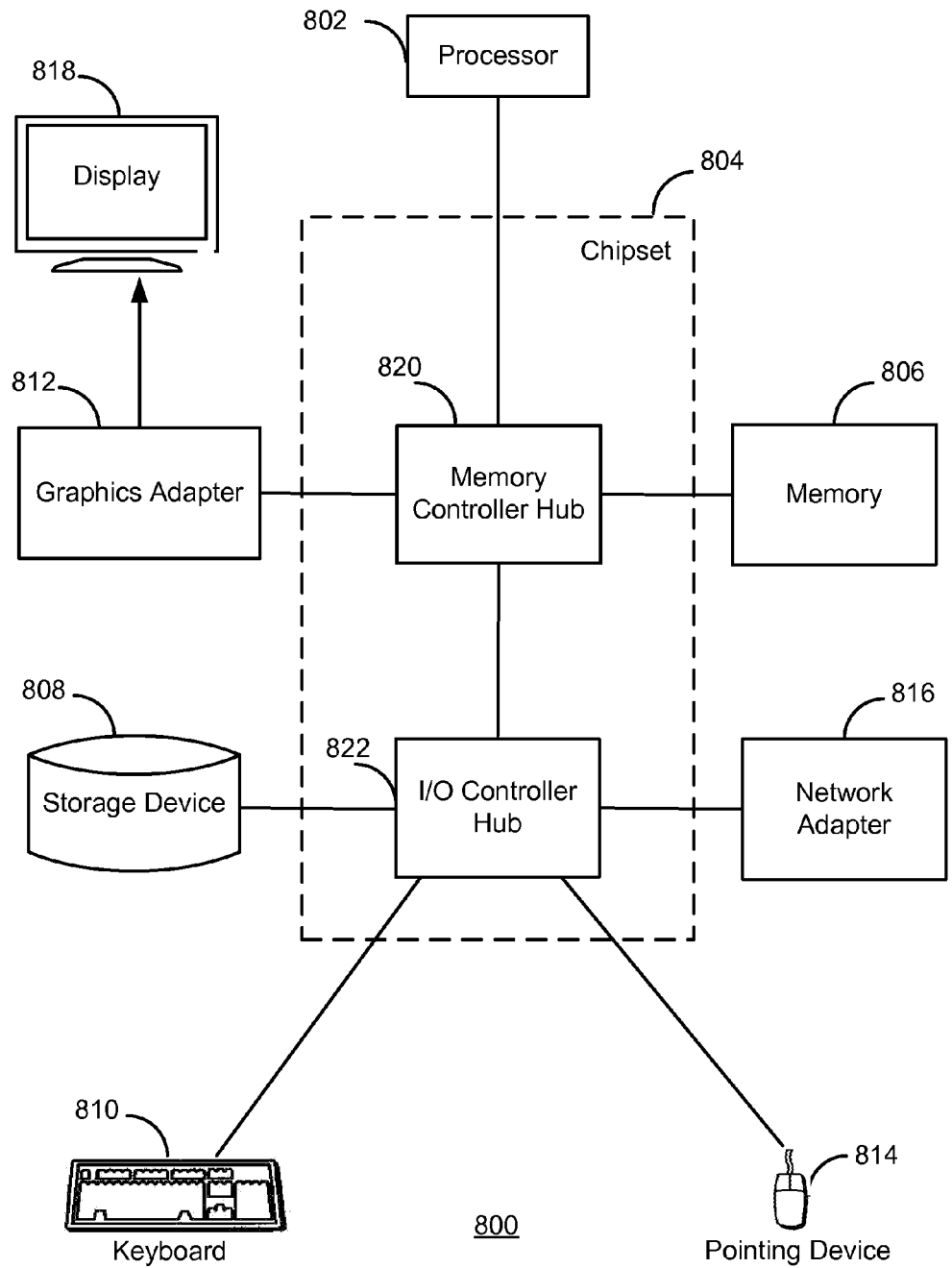
FIG. 8 is a high-level block diagram of the components of a computing system for use, for example, as the server system depicted in FIG. 1, in accordance with an embodiment.

FIG. 8 is a high-level block diagram of the components of a computing system 800 for use, for example, as the server system 100 depicted in FIG. 1, in accordance with an embodiment. Illustrated are at least one processor 802 coupled to a chipset 804. Also coupled to the chipset 804 are a memory 806, a storage device 808, a keyboard 810, a graphics adapter 812, a pointing device 814, and a network adapter 816. A display 818 is coupled to the graphics adapter 812. In one embodiment, the functionality of the chipset 804 is provided by a memory controller hub 820 and an I/O controller hub 822. In another embodiment, the memory 806 is coupled directly to the processor 802 instead of the chipset 804.

The storage device 808 is any non-transitory computer-readable storage medium, such as a hard drive, compact disk read-only memory (CD-ROM), DVD, or a solid-state memory device. The memory 806 holds instructions and data used by the processor 802. The pointing device 814 may be a mouse, track ball, or other type of pointing device, and is used in combination with the keyboard 810 to input data into the computer 800. The graphics adapter 812 displays images and other information on the display 818. The network adapter 816 couples the computer 800 to a network.

As is known in the art, a computer 800 can have different and/or other components than those shown in FIG. 8. In addition, the computer 800 can lack certain illustrated components. In one embodiment, a computer 800 acting as a server may lack a keyboard 810, pointing device 814, graphics adapter 812, and/or display 818. Moreover, the storage device 808 can be local and/or remote from the computer 800 (such as embodied within a storage area network (SAN)).

As is known in the art, the computer 800 is adapted to execute computer program modules for providing functionality described herein. As used herein, the term "module" refers to computer program logic utilized to provide the specified functionality. Thus, a module can be implemented in hardware, firmware, and/or software. In one embodiment, program modules are stored on the storage device 808, loaded into the memory 806, and executed by the processor 802.

Embodiments of the physical components described herein can include other and/or different modules than the ones described here. In addition, the functionality attributed to the modules can be performed by other or different modules in other embodiments. Moreover, this description occasionally omits the term "module" for purposes of clarity and convenience.

Additional Configuration Considerations

Some portions of the above description describe the embodiments in terms of algorithmic processes or operations. These algorithmic descriptions and representations are commonly used by those skilled in the data processing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality. The described operations and their associated modules may be embodied in software, firmware, hardware, or any combinations thereof.

The present invention also relates to an apparatus for performing the operations herein. This apparatus may be specially constructed for the required purposes, or it may comprise a general-purpose computer selectively activated or reconfigured by a computer program stored on a computer readable medium that can be accessed by the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of computer-readable storage medium suitable for storing electronic instructions, and each coupled to a computer system bus. Furthermore, the computers referred to in the specification may include a single processor or may be architectures employing multiple processor designs for increased computing capability.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the disclosure. This description should be read to include one or at least one and the singular also includes the plural unless it is obvious that it is meant otherwise.

Upon reading this disclosure, those of skill in the art will appreciate still additional alternative structural and functional designs for a system and a process for separation of models based on the presence or absence of a feature set and the selection of a model based on the presence or absence of a feature set. Thus, while particular embodiments and applications have been illustrated and described, it is to be understood that the present invention is not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A computer-implemented method of building differentiated models, the method comprising:

receiving a selection of one or more features on which to build separate models based on the presence or absence of the one or more features, the one or more features comprising a non-converting visit to an advertiser's website;

applying a first filter to separate entities into a first group having the one or more features and a second group not having the one or more features, the first group of entities having at least one non-converting visit to the advertiser's website and the second group of entities not having at least one non-converting visit to the advertiser's website;

for the first group:
identifying a first archetypical population of entities from the first group, the first archetypical population comprising converters having a non-converting visit to the advertiser's website prior to conversion;
identifying a first standard population of entities from the first group, the first standard population comprising non-converters which visited the advertiser's website; and
determining a first feature set for inclusion in a first model based on a strength of correlation between each feature in the first feature set and being in the first archetypical population as compared to the first standard population;

for the second group:
identifying a second archetypical population of entities from the second group, the second archetypical population comprising converters which converted on a first visit to the advertiser's website, the second archetypical population different from the first archetypical population;

identifying a second standard population of entities from the second group, the second standard population comprising non-converters which did not visit the advertiser's website, the second standard population different from the first standard population; and determining a second feature set for inclusion in a second model based on a strength of correlation between each feature in the second feature set and being in the second archetypical population as compared to the second standard population;

accessing a media consumption history of a specified entity;

determining which of the first model or the second model is applicable to the specified entity based on the presence or absence of a non-converting visit to the advertiser's website in a media consumption history of the specified entity;

scoring the specified entity based on the applicable model; and bidding on an opportunity to expose the specified entity to advertising content based on a result of the scoring.

2. The method of claim 1, further comprising:
for the second group:
 filtering the second group to select entities having at least one additional feature;
 identifying a third archetypical population from the selected entities having the at least one additional feature; and
 determining a third feature set for inclusion in a third model based on a strength of correlation between each feature in the third feature set and being in the third archetypical population as compared to the second standard population.

3. The method of claim 2, further comprising:
responsive to determining that the second model is applicable to the specified entity, determining if the third model is applicable to the specified entity based on features in the specified entity's media consumption history; and
scoring the specified entity based on a combination of scores from the applicable models.

4. The method of claim 1 further comprising:
identifying an additional archetypical population from the first group, the additional archetypical population comprising non-converters which visited the advertiser's website;
determining an additional feature set for inclusion in a third model based on a strength of correlation between each feature in the additional feature set and being in the additional archetypical population as compared to the second standard population.

5. The method of claim 4 further comprising:
responsive to determining that the second model is applicable to the specified entity, applying the third model to the specified entity to produce a score from the third model; and
scoring the specified entity based on a combination of scores from the second model and the third model.

6. A non-transitory computer readable storage medium storing computer program instructions for building differentiated models, the computer program instructions comprising instructions for:
receiving a selection of one or more features on which to build separate models based on the presence or absence of the one or more features, the one or more features comprising a non-converting visit to an advertiser's website;

applying a first filter to separate entities into a first group having the one or more features and a second group not having the one or more features, the first group of entities having at least one non-converting visit to the advertiser's website and the second group of entities not having at least one non-converting visit to the advertiser's website;

for the first group:
 identifying a first archetypical population of entities from the first group, the first archetypical population comprising converters having a non-converting visit to the advertiser's website prior to conversion;
 identifying a first standard population of entities from the first group, the first standard population comprising non-converters which visited the advertiser's website; and
 determining a first feature set for inclusion in a first model based on a strength of correlation between each feature in the first feature set and being in the first archetypical population as compared to the first standard population;

for the second group:
 identifying a second archetypical population of entities from the second group, the second archetypical population comprising converters which converted on a first visit to the advertiser's website, the second archetypical population different from the first archetypical population;
 identifying a second standard population of entities from the second group, the second standard population comprising non-converters which did not visit the advertiser's website, the second standard population different from the first standard population; and
 determining a second feature set for inclusion in a second model based on a strength of correlation between each feature in the second feature set and being in the second archetypical population as compared to the second standard population;

accessing a media consumption history of a specified entity;

determining which of the first model or the second model is applicable to the specified entity based on the presence or absence of a non-converting visit to the advertiser's website in a media consumption history of the specified entity;

scoring the specified entity based on the applicable model; and bidding on an opportunity to expose the specified entity to advertising content based on a result of the scoring.

7. The storage medium of claim 6, wherein the computer program instructions further comprise instructions for:
for the second group:
 filtering the second group to select entities having at least one additional feature;
 identifying a third archetypical population from the selected entities having the at least one additional feature; and
 determining a third feature set for inclusion in a third model based on a strength of correlation between each feature in the third feature set and being in the third archetypical population as compared to the second standard population.

8. The storage medium of claim 7, wherein the computer program instructions further comprise instructions for:

responsive to determining that the second model is applicable to the specified entity, determining if the third model is applicable to the specified entity based on features in the specified entity's media consumption history; and scoring the specified entity based on a combination of scores from the applicable models.

9. A system comprising:

a processor;

a computer readable storage medium storing processor-executable computer program instructions for building differentiated models, the computer program instructions comprising instructions for:

receiving a selection of one or more features on which to build separate models based on the presence or absence of the one or more features, the one or more features comprising a non-converting visit to an advertiser's website;

applying a first filter to separate entities into a first group having the one or more features and a second group not having the one or more features, the first group of entities having at least one non-converting visit to the advertiser's website and the second group of entities not having at least one non-converting visit to the advertiser's website;

for the first group:

identifying a first archetypical population of entities from the first group, the first archetypical population comprising converters having a non-converting visit to the advertiser's website prior to conversion;

identifying a first standard population of entities from the first group, the first standard population comprising non-converters which visited the advertiser's website; and determining a first feature set for inclusion in a first model based on a strength of correlation between each feature in the first feature set and being in the first archetypical population as compared to the first standard population;

for the second group:

identifying a second archetypical population of entities from the second group, the second archetypical population comprising converters which converted on a first visit to the advertiser's website, the second archetypical population different from the first archetypical population;

identifying a second standard population of entities from the second group, the second standard population comprising non-converters which did not visit the advertiser's website, the second standard population different from the first standard population; and determining a second feature set for inclusion in a second model based on a strength of correlation between each feature in the second feature set and being in the second archetypical population as compared to the second standard population;

accessing a media consumption history of a specified entity;

determining which of the first model or the second model is applicable to the specified entity based on the presence or absence of a non-converting visit to the advertiser's website in a media consumption history of the specified entity;

scoring the specified entity based on the applicable model; and bidding on an opportunity to expose the specified entity to advertising content based on a result of the scoring.

10. The system of claim 9, wherein the computer program instructions further comprise instructions for:

for the second group:

filtering the second group to select entities having at least one additional feature;

identifying a third archetypical population from the selected entities having the at least one additional feature; and determining a third feature set for inclusion in a third model based on a strength of correlation between each feature in the third feature set and being in the third archetypical population as compared to the second standard population.

11. The system of claim 10, wherein the computer program instructions further comprise instructions for:

responsive to determining that the second model is applicable to the specified entity, determining if the third model is applicable to the specified entity based on features in the specified entity's media consumption history; and scoring the specified entity based on a combination of scores from the applicable models.

12. The system of claim 9, wherein the computer program instructions further comprise instructions for:

identifying an additional archetypical population from the first group, the additional archetypical population comprising non-converters which visited the advertiser's web site;

determining an additional feature set for inclusion in a third model based on a strength of correlation between each feature in the additional feature set and being in the additional archetypical population as compared to the second standard population.

13. The system of claim 12, wherein the computer program instructions further comprise instructions for:

responsive to determining that the second model is applicable to the specified entity, applying the third model to the specified entity to produce a score from the third model; and scoring the specified entity based on a combination of scores from the second model and the third model.

14. The system of claim 9, wherein the computer program instructions further comprise instructions for:

identifying an additional archetypical population from the first group, the additional archetypical population comprising non-converters which visited the advertiser's website;

determining an additional feature set for inclusion in a third model based on a strength of correlation between each feature in the additional feature set and being in the additional archetypical population as compared to the second standard population.

15. The system of claim 14, wherein the computer program instructions further comprise instructions for:

responsive to determining that the second model is applicable to the specified entity, applying the third model to the specified entity to produce a score from the third model; and scoring the specified entity based on a combination of scores from the second model and the third model.

* * * * *